United States Patent
Jin et al.

(10) Patent No.: US 10,020,183 B1
(45) Date of Patent: Jul. 10, 2018

(54) EDGE ROUGHNESS REDUCTION

(71) Applicant: Lam Research Corporation, Fremont, CA (US)

(72) Inventors: Yansha Jin, Fremont, CA (US); Zhongkui Tan, San Jose, CA (US); Lin Cui, Dublin, CA (US); Qian Fu, Pleasanton, CA (US); Martin Shim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/637,828

(22) Filed: Jun. 29, 2017

(51) Int. Cl.
*H01L 21/02* (2006.01)
*H01L 21/302* (2006.01)

(52) U.S. Cl.
CPC .. *H01L 21/02021* (2013.01); *H01L 21/02019* (2013.01); *H01L 21/02035* (2013.01); *H01L 21/02312* (2013.01); *H01L 21/02315* (2013.01); *H01L 21/02337* (2013.01); *H01L 21/302* (2013.01)

(58) Field of Classification Search
CPC ......... H01L 21/02021; H01L 21/02019; H01L 21/02035; H01L 21/02312; H01L 21/02315; H01L 21/02337; H01L 21/302
See application file for complete search history.

(56) References Cited

U.S. PATENT DOCUMENTS

| 2008/0188081 | A1* | 8/2008 | Chi | H01L 21/31116 438/700 |
| 2012/0223048 | A1* | 9/2012 | Paranjpe | C23C 14/042 216/22 |
| 2017/0256395 | A1* | 9/2017 | Raley | C23C 16/34 |

* cited by examiner

*Primary Examiner* — Duy Vu N Deo
(74) *Attorney, Agent, or Firm* — Beyer Law Group LLP

(57) ABSTRACT

A method for processing a stack with an etch layer below a mask is provided. The mask is treated by flowing a treatment gas, wherein the treatment gas comprises a sputtering gas and a trimming gas, providing pulsed TCP power to create a plasma from the treatment gas, and providing a pulsed bias, wherein the pulsed bias has a same period as the pulsed TCP power, wherein the pulsed TCP power and pulsed bias provide a first state with a first bias above a sputter threshold and a first TCP power, which causes species from the sputtering gas to sputter and redeposit material from the mask, and provide a second state with a second bias below the sputter threshold and a second TCP power, wherein the second TCP power is greater than the first TCP power, which causes species from the trimming gas to chemically trim the mask.

14 Claims, 6 Drawing Sheets

US 10,020,183 B1

EDGE ROUGHNESS REDUCTION

BACKGROUND

The present disclosure relates to the formation of semiconductor devices. More specifically, the disclosure relates to the formation of semiconductor devices by etching features.

During semiconductor wafer processing, features may be etched into various layers. Increased line edge roughness or line width roughness of the etched features may increase device leakage.

SUMMARY

To achieve the foregoing and in accordance with the purpose of the present disclosure, a method for processing a stack with an etch layer below a mask in a plasma processing chamber is provided. The mask is treated by continuously flowing a treatment gas into the plasma processing chamber, wherein the treatment gas comprises a sputtering gas and a trimming gas, providing pulsed TCP power to create a plasma from the treatment gas, and providing a pulsed bias, wherein the pulsed bias has a same period as the pulsed TCP power, wherein the pulsed TCP power and pulsed bias provide a first state with a first bias above a sputter threshold and a first TCP power, which causes species from the sputtering gas to sputter and redeposit material from the mask, and provide a second state with a second bias below the sputter threshold and a second TCP power, wherein the second TCP power is greater than the first TCP power, which causes species from the trimming gas to chemically trim the mask.

In another manifestation, a method for processing a stack with an etch layer below a mask in a plasma processing chamber is provided. The mask is treated is by continuously flowing a treatment gas into the plasma processing chamber, wherein the treatment gas comprises a sputtering gas and a trimming gas, providing TCP power to create a plasm from the treatment gas, and providing a pulsed bias, wherein the pulsed bias provides a first state with a first bias above a sputter threshold, which causes species from the sputtering gas to sputter and redeposit material from the mask, and provides a second state with a second bias below the sputter threshold, which causes species from the trimming gas to chemically trim the mask. The etch layer is etched below the mask after treating the mask.

These and other features will be described in more detail below in the detailed description and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
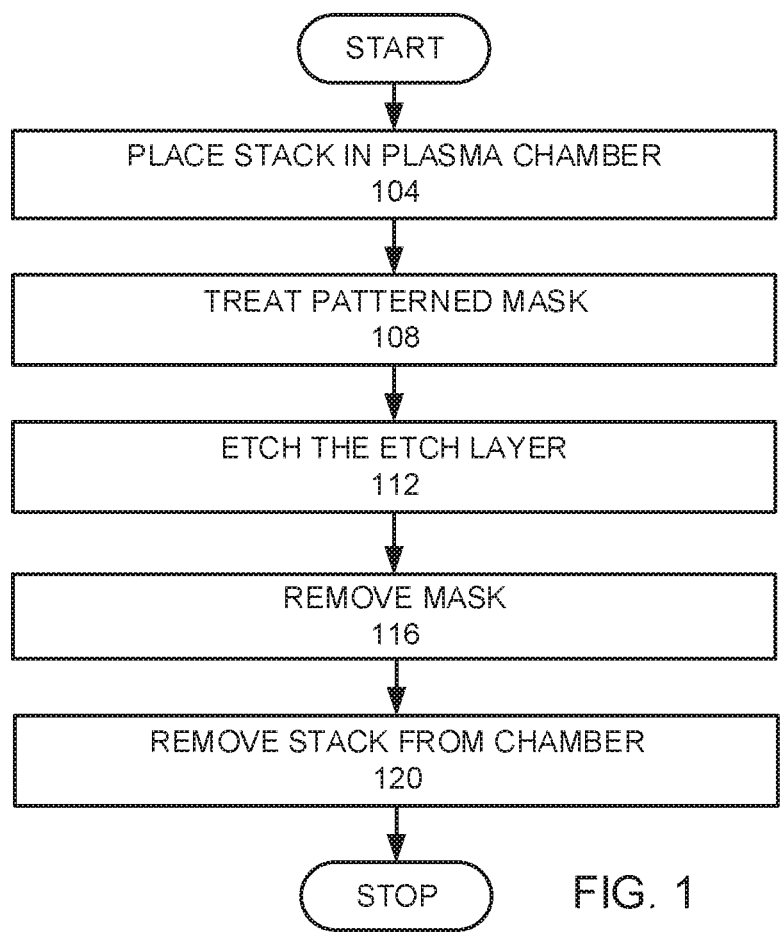
FIG. 1 is a high level flow chart of a process that may be used in an embodiment.
Figure 2:
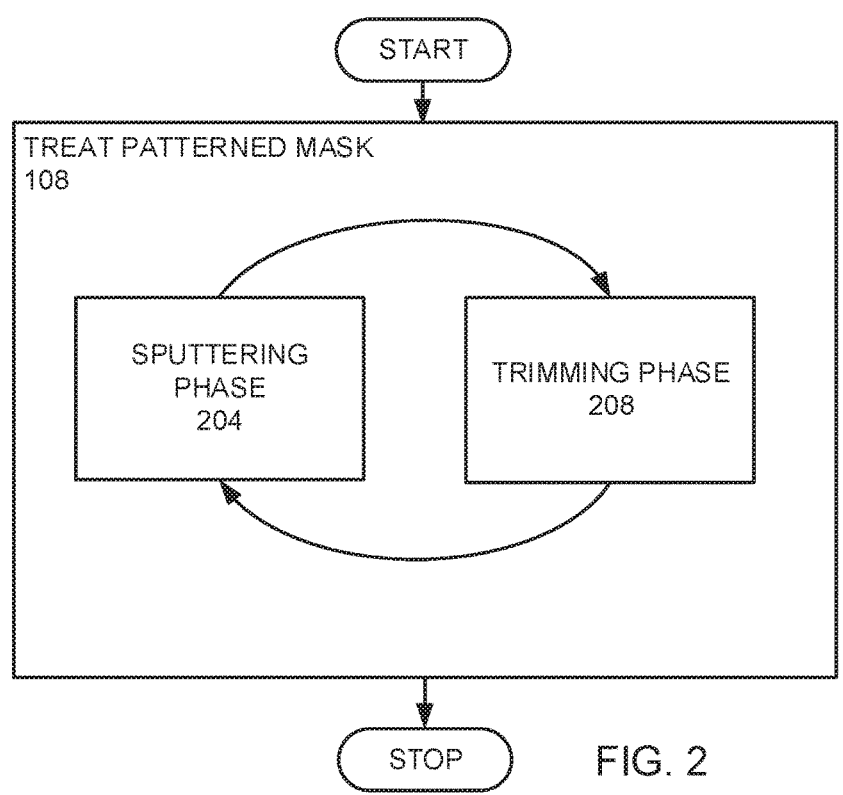
FIG. 2 is a more detailed flow chart of the step of treating the patterned mask.

To facilitate understanding, FIG. 1 is a high level flow chart of an embodiment. A stack with a patterned mask over an etch layer is placed on a substrate support in a plasma chamber (step 104). The patterned mask is treated (step 108). The etch layer is etched (step 112). The mask is removed (step 116). The stack is removed from the plasma chamber (step 120). FIG. 2 is a more detailed flow chart of the step of treating the patterned mask (step 108). The treating the patterned mask (step 108) comprises a plurality of cycles where each cycle comprises a sputtering phase (step 204) and trimming phase (step 208).

Example

Figure 3A:
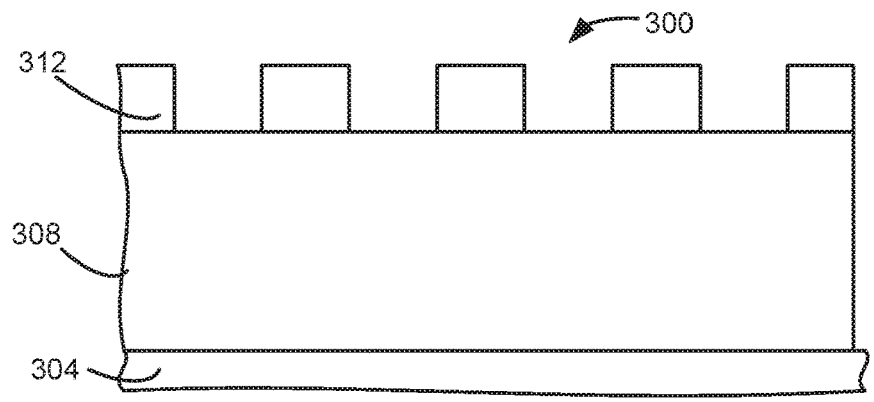
FIGS. 3A-D are schematic cross-sectional views of a stack processed according to an embodiment.
Figure 4A:
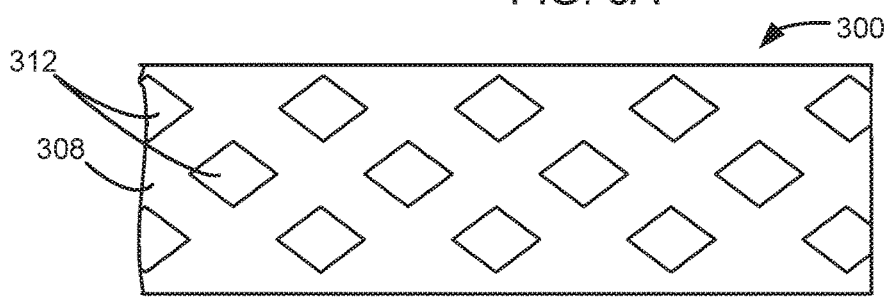
FIGS. 4A-B are top views of a line of the stack processed according to an embodiment.

In an example of an implementation of the invention, a stack is placed on a substrate support in a plasma chamber (step 104). FIG. 3A is a cross sectional schematic view of a stack 300 with a substrate 304 disposed below an etch layer 308, disposed below a patterned mask 312. In this example, the patterned mask 312 is a silicon oxide mask and the etch layer 308 is a conductive layer of tungsten. In various embodiments, one or more layers may be between the substrate 304 and the etch layer 308, or between the etch layer 308 and the patterned mask 312. FIG. 4A is a top schematic view of the stack 300 with the etch layer 308 and the patterned mask 312. In this embodiment, the patterned mask forms diamond shaped patterns, as shown. The diamond shaped pattern is provided by two sets of parallel line patterns which intersect at nonperpendicular angles. Etching the etch layer 308 with a mask with circular patterns would be more desirable.

Figure 5:
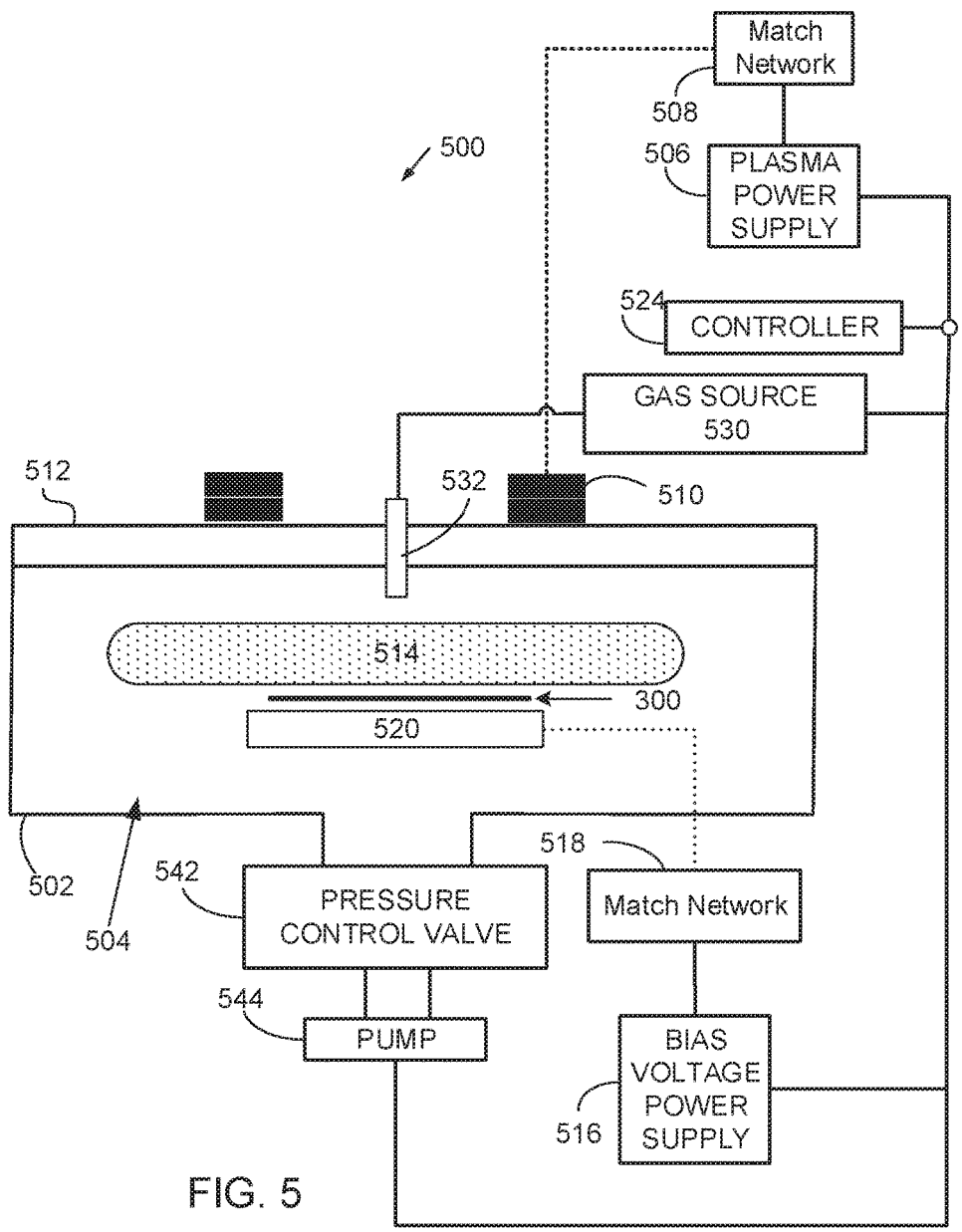
FIG. 5 is a schematic view of a plasma processing chamber that may be used in practicing the embodiment.

FIG. 5 schematically illustrates an example of a plasma processing system 500 which may be used to perform the processing of the stack 300 in accordance with one embodiment of the present invention. The plasma processing system 500 includes a plasma reactor 502 having a plasma processing chamber 504 therein. A plasma power supply 506, tuned by a match network 508, supplies power to a TCP coil 510 located near a power window 512 to create a plasma 514 in the plasma processing chamber 504 by providing an inductively coupled power. The TCP coil (upper power source) 510 may be configured to produce a uniform diffusion profile within the plasma processing chamber 504. For example, the TCP coil 510 may be configured to generate a toroidal power distribution in the plasma 514. The power window 512 is provided to separate the TCP coil 510 from the plasma processing chamber 504 while allowing energy to pass from the TCP coil 510 to the plasma processing chamber 504. A wafer bias voltage power supply 516 tuned by a match network 518 provides power to an electrode 520 to set the bias voltage on the substrate 304 which is supported by the electrode 520. A controller 524 sets points for the plasma power supply 506 and the wafer bias voltage power supply 516.

The plasma power supply 506 and the wafer bias voltage power supply 516 may be configured to operate at specific radio frequencies such as, for example, 13.56 MHz, 27 MHz, 2 MHz, 400 kHz, or combinations thereof. Plasma power supply 506 and wafer bias voltage power supply 516 may be appropriately sized to supply a range of powers in order to achieve desired process performance. For example, in one embodiment of the present invention, the plasma power supply 506 may supply the power in a range of 50 to 5000 Watts, and the wafer bias voltage power supply 516 may supply a bias voltage of in a range of 20 to 2000 V. In addition, the TCP coil 510 and/or the electrode 520 may be comprised of two or more sub-coils or sub-electrodes, which may be powered by a single power supply or powered by multiple power supplies.

As shown in FIG. 5, the plasma processing system 500 further includes a gas source/gas supply mechanism 530. The gas source/gas supply mechanism 530 provides gas to a gas inlet 532. Process gases and byproducts are removed from the plasma processing chamber 504 via a pressure control valve 542 and a pump 544, which also serve to maintain a particular pressure within the plasma processing chamber 504. The gas source/gas supply mechanism 530 and pump 544 are controlled by the controller 524. A Kiyo by Lam Research Corp. of Fremont, Calif., may be used to practice an embodiment.

Figure 6:
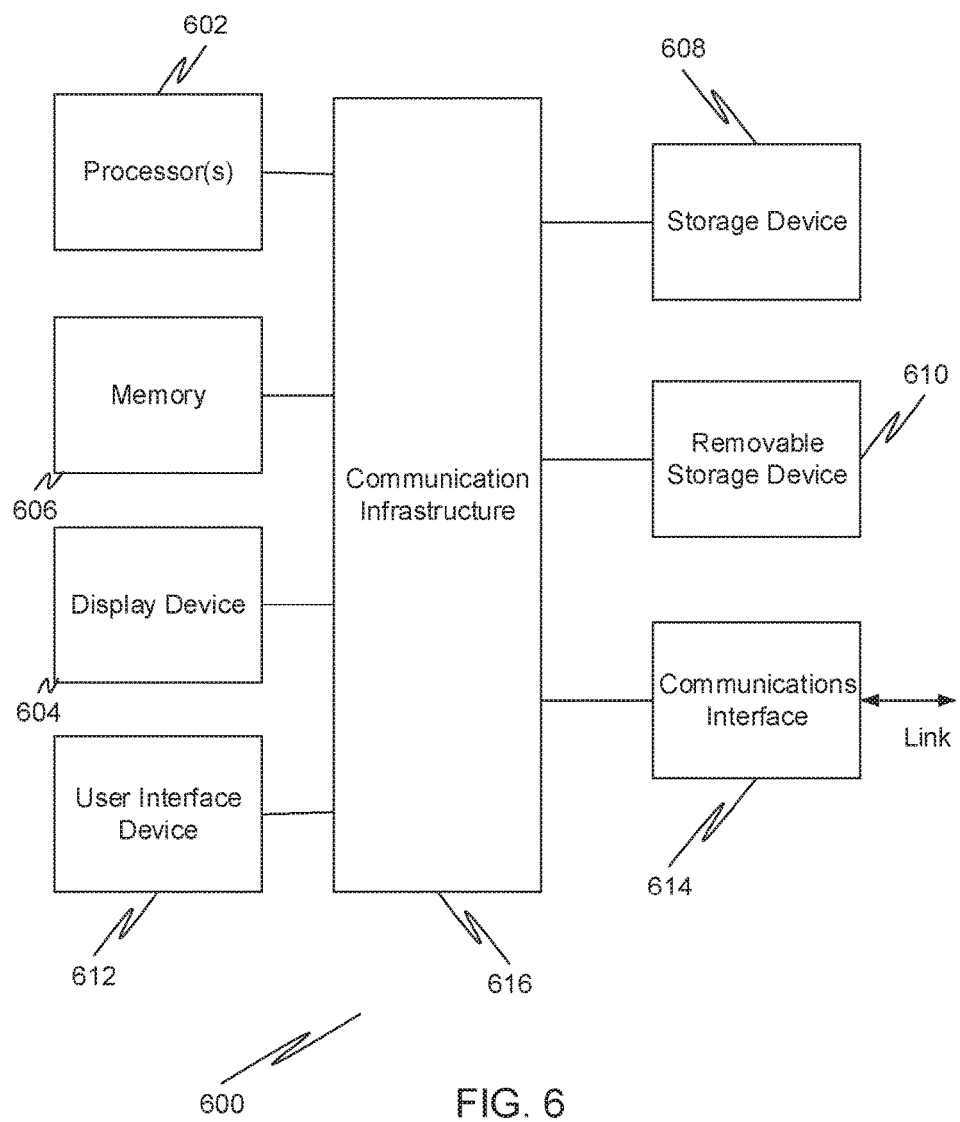
FIG. 6 illustrates a computer system, which is suitable for implementing a controller used in embodiments.

FIG. 6 is a high level block diagram showing a computer system 600, which is suitable for implementing a controller 524 used in embodiments of the present invention. The computer system may have many physical forms ranging from an integrated circuit, a printed circuit board, and a small handheld device up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments of the present invention may execute solely upon the processors or may execute over a network, such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The patterned mask is treated (step 108). FIG. 2 is a more detailed flow chart of the step of treating the patterned mask (step 108). The treating the patterned mask (step 108) comprises a plurality of cycles where each cycle comprises a sputtering phase (step 204) and a trimming phase (step 208). For both the sputtering phase (step 204) and the trimming phase (step 208), a treatment gas is continuously provided. The treatment gas comprises a sputtering gas and a trimming gas. In this example, the treatment gas is 1200 sccm $O_2$, as the sputtering gas, and 60 sccm $CF_4$, as the trimming gas. During the sputtering phase (step 204), a TCP power of 200 Watts at 13.56 MHz with a bias of a magnitude of at least 200 volts is provided. The bias is above a sputter threshold of the material forming the patterned mask. As a result, during the sputtering phase, some of the mask is sputtered away and redeposited on another part of the mask. During the trimming phase (step 208), a TCP power of 1500 Watts is provided at 13.56 MHz with a bias with a magnitude of less than 100 volts is provided. The bias is below the sputter threshold of the material forming the patterned mask. Therefore, material is not sputtered and redeposited on the mask during the trimming phase. Instead, plasma components from the trimming gas chemically interact with the mask to cause the mask to be chemically trimmed.

Figure 3B:
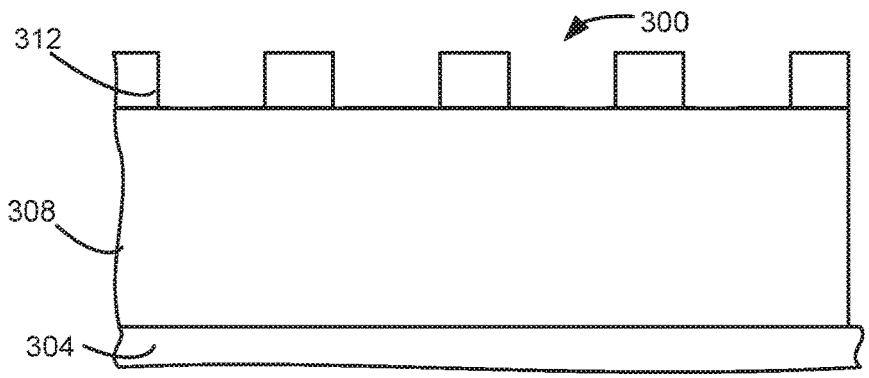
Figure 4B:
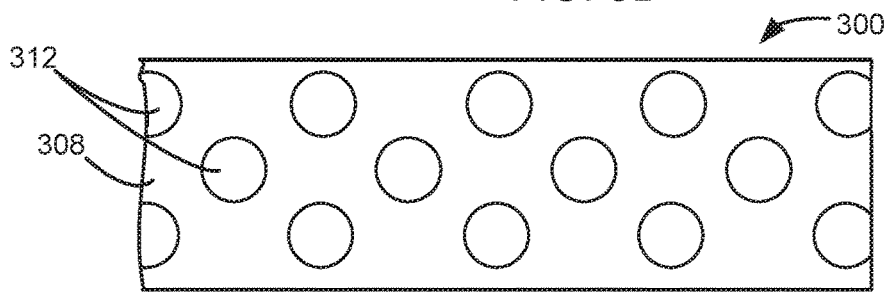

FIG. 3B is a cross sectional schematic view of the stack 300 after treatment of the patterned mask 108. FIG. 4B is a top schematic view of the line after treatment of the patterned mask 108. During the sputtering, some of the sidewall of the mask 312 is sputtered and redeposited on other parts of the mask 312. A combination of sputtering and redeposition alternating with chemically trimming causes the diamond pattern mask 312 to form into the circular pattern mask, as shown. In addition, it has been found that line edge roughness and line width roughness is reduced.

Figure 3C:
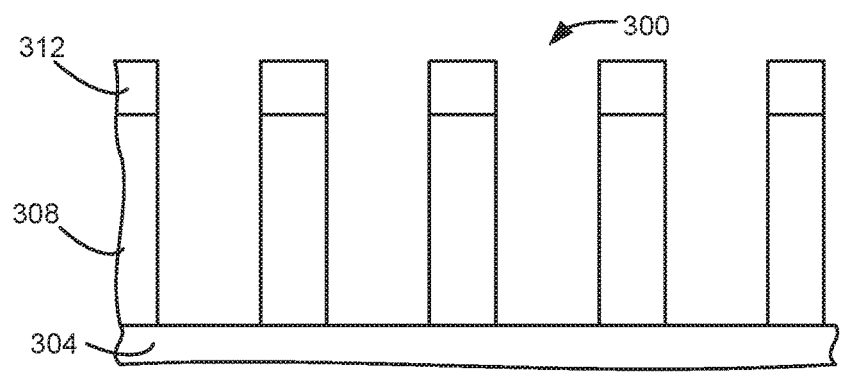
Figure 3D:
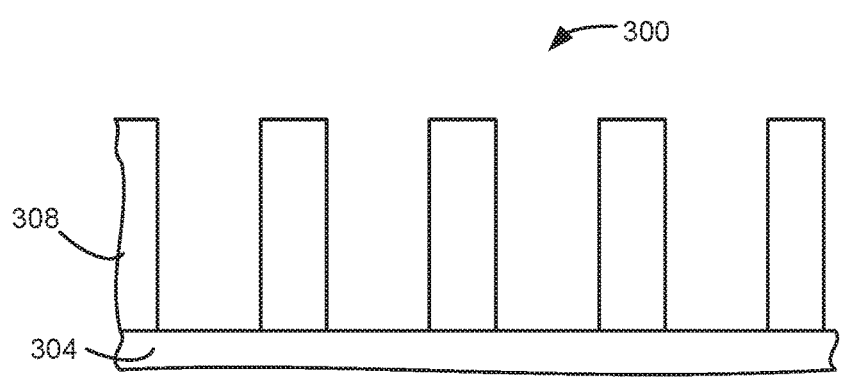

The etch layer is etched (step 112). A sample recipe for etching the etch layer provides an etching gas comprising 20 sccm $Cl_2$, 13 sccm $NF_3$, 15 sccm $O_2$, and 125 sccm $N_2$ at a pressure of 3 mTorr. A plasma is formed from the etching gas by providing 400 Watts TCP power. A bias voltage of 80 volts is provided. FIG. 3C is a side schematic view of the stack 300 after the etch layer 304 has been etched. The mask is removed (step 116). FIG. 3D is a side schematic view of the stack 300 after the mask is removed. The stack is removed from the chamber (step 120). Since in this embodiment, the etch layer is a conductive layer, by etching away the conductive layer except for the area covered by the circular shaped mask pattern, conductive pads may be formed.

This embodiment allows diamond shaped mask patterns to be formed into circular shaped mask patterns. In addition, the embodiment reduces line edge roughness and line width roughness. The reduction of line edge roughness and line width roughness is accomplished by the same mechanism that changes the shape of the patterned mask. The sputtering selectively removes parts of the roughness that extend out from (or bumps in) the patterned mask, like the corners of the diamond shape. The redeposition selectively adds to more recessed parts of (or dips in) the patterned mask, such as the middle of the sides of the diamond shape. The trimming prevents growth in Critical Dimension (CD). By selectively removing parts that extend out and selectively depositing on recessed parts and trimming to prevent CD growth, the mask has reduced line edge roughness and/or line width roughness. This provides etched features with reduced line edge roughness and/or line width roughness.

Various embodiments provide a constant gas flow during the treating the mask, while the plasma and bias power are pulsed. By only pulsing bias power and plasma power without pulsing gas flow, the pulsing may be at a higher frequency. Preferably, the bias power and plasma power are pulsed at a frequency between 1 Hz and 10 kHz, inclusive. More preferably, the bias power and plasma power are pulsed at a frequency between 10 Hz and 1 kHz, inclusive. Most preferably, the bias power and plasma power are pulsed at a frequency between 100 Hz and 500 Hz, inclusive. In some embodiments, only the bias power is pulsed. Preferably, both the bias power and plasma power are pulsed synchronously with the same period and out of phase, so that the bias power is highest when the plasma power is lowest and the plasma power is highest when the bias power is lowest. For a silicon oxide mask, the sputter threshold is 120 volts. During the sputtering phase, the magnitude of the bias power is preferably at least 200 volts. More preferably, the magnitude of the bias power is between 200 and 1500 volts. During the trimming, the magnitude of the bias is preferably less than 100 volts. More preferably, during the trimming, no bias is applied.

In various embodiments, the trimming gas may be a halogen containing gas. Preferably, the halogen containing gas contains fluorine. Preferably, the treatment gas further comprises a passivation gas. Preferably, the passivation gas is at least one of COS or $SO_2$. In various embodiments, the sputtering gas may comprise Ar or $O_2$. $O_2$ is inert with respect to the $SiO_2$ mask and may be able to remove any remaining photoresist or other organic residue. The sputtering and redeposition of the mask may also be called redistribution of the mask.

In other embodiments, the etch layer may be conductive materials such as Ti, TiN, W, or WN. In other embodiments, intermediate layers may be placed between the patterned mask and the etch layer. Separate etching processes may be used to etch the intermediate layers or a plurality of layers may be etched with a single etching process. Such intermediate layers may be conductive layers or dielectric layers or other types of layers. Such layers may be antireflective coatings.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for processing a stack with an etch layer below a mask in a plasma processing chamber, comprising:
    treating the mask, comprising:
        continuously flowing a treatment gas into the plasma processing chamber, wherein the treatment gas comprises a sputtering gas and a trimming gas;
        providing pulsed TCP power to create a plasma from the treatment gas; and
        providing a pulsed bias, wherein the pulsed bias has a same period as the pulsed TCP power, wherein the pulsed TCP power and pulsed bias provide a first state with a first bias above a sputter threshold and a first TCP power, which causes species from the sputtering gas to sputter and redeposit material from the mask, and provide a second state with a second bias below the sputter threshold and a second TCP power, wherein the second TCP power is greater than the first TCP power, which causes species from the trimming gas to chemically trim the mask.

2. The method, as recited in claim 1, wherein the continuously flowing the treatment gas provides a constant flow of the treatment gas when the pulsed TCP power and the pulsed bias are being provided.

3. The method, as recited in claim 1, wherein the pulsed TCP power and pulsed bias are synchronous and out of phase.

4. The method, as recited in claim 1, wherein the mask comprises a silicon oxide based material and the sputtering gas comprises $O_2$ and the trimming gas comprises a halogen containing gas.

5. The method, as recited in claim 1, wherein the treatment gas further comprises a passivation gas.

6. The method, as recited in claim 5, wherein the passivation gas comprises at least one of COS or $SO_2$.

7. The method, as recited in claim 1, wherein the pulsed TCP power and pulsed bias have a frequency between 1 Hz and 10 kHz, inclusive.

8. The method, as recited in claim 1, further comprising etching the etch layer below the mask after treating the mask.

9. The method, as recited in claim 8, further comprising removing the mask.

10. The method, as recited in claim 1, wherein the mask forms diamond patterns and wherein the treating the mask transforms the diamond patters to circular patterns.

11. A method for processing a stack with an etch layer below a mask in a plasma processing chamber, comprising:
    treating the mask, comprising:
        continuously flowing a treatment gas into the plasma processing chamber, wherein the treatment gas comprises a sputtering gas and a trimming gas;
        providing TCP power to form the treatment gas into a plasma; and
        providing a pulsed bias, wherein the pulsed bias provides a first state with the a first bias above a sputter threshold, which causes species from the sputtering gas to sputter and redeposit material from the mask, and provides a second state with a second bias below the sputter threshold, which causes species from the trimming gas to chemically trim the mask; and
    etching the etch layer below the mask after treating the mask.

12. The method, as recited in claim 11, wherein the continuously flowing the treatment gas provides a constant flow of the treatment gas when the pulsed bias is being provided.

13. The method, as recited in claim 11, further comprising removing the mask.

14. The method, as recited in claim 11, wherein the mask forms diamond patterns and wherein the treating the mask transforms the diamond patters to circular patterns.

* * * * *